US012756368B2

(12) United States Patent
Kanaya et al.

(10) Patent No.: US 12,756,368 B2
(45) Date of Patent: Oct. 6, 2026

(54) POWER AMPLIFIER AND RADIO FREQUENCY MODULE

(71) Applicant: Mitsubishi Electric Corporation, Tokyo (JP)

(72) Inventors: Ko Kanaya, Tokyo (JP); Kazuya Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 495 days.

(21) Appl. No.: 18/548,214

(22) PCT Filed: Jun. 30, 2021

(86) PCT No.: PCT/JP2021/024816

§ 371 (c)(1),
(2) Date: Aug. 28, 2023

(87) PCT Pub. No.: WO2023/276063

PCT Pub. Date: Jan. 5, 2023

(65) Prior Publication Data

US 2024/0146262 A1 May 2, 2024

(51) Int. Cl.
*H03F 3/191* (2006.01)
*H03F 1/56* (2006.01)
(Continued)

(52) U.S. Cl.
CPC ............... *H03F 3/245* (2013.01); *H03F 1/56* (2013.01); *H03F 3/195* (2013.01); *H10W 44/20* (2026.01);
(Continued)

(58) Field of Classification Search
CPC ................................... H03F 3/191; H03F 1/30
(Continued)

(56) References Cited

U.S. PATENT DOCUMENTS 6,876,270 B2 * 4/2005 Ono ...................... H01P 1/2013 333/33
7,501,897 B2 * 3/2009 Mori ......................... H03F 3/24 330/310
8,427,241 B2 * 4/2013 Ezzeddine ............ H03F 1/0205 330/311
(Continued)

OTHER PUBLICATIONS

Qorvo, TGA2239-CP, 13.4-15.5 GHz, 50 Watt, GaN Power Amplifier, Product Data Sheet, Rev. B, Feb. 2021 <URL: https://www.qorvo.com/products/p/TGA2239-CP>.
(Continued)

*Primary Examiner* — Henry Choe
(74) *Attorney, Agent, or Firm* — Studebaker Brackett PLLC

(57) ABSTRACT

A power amplifier according to the present disclosure includes an input terminal that receives a high-frequency signal from an outside, an MMIC that receives the high-frequency signal via the input terminal and amplifies the high-frequency signal, an input matching circuit, a transistor that receives, via the input matching circuit, the high-frequency signal amplified by the MMIC and amplifies the high-frequency signal, an output matching circuit, an output terminal that receives a drain voltage of the transistor from the outside, receives, via the output matching circuit, the high-frequency signal amplified by the transistor, and outputs the high-frequency signal to the outside and a drain bias circuit board that connects a drain of the transistor and a drain of the MMIC, wherein the transistor and the MMIC are conjugately matched at impedance smaller than 50 Ω.

18 Claims, 12 Drawing Sheets

(51) Int. Cl.
*H03F 3/195* (2006.01)
*H03F 3/24* (2006.01)
*H10W 44/20* (2026.01)

(52) U.S. Cl.
CPC ..... *H03F 2200/451* (2013.01); *H10W 44/206* (2026.01); *H10W 44/234* (2026.01)

(58) Field of Classification Search
USPC .......................................... 330/302, 296, 285
See application file for complete search history.

(56) References Cited

U.S. PATENT DOCUMENTS

2005/0140434 A1* 6/2005 Abe ..................... H05K 1/0265 330/66
2024/0267009 A1* 8/2024 Du .......................... H03F 3/211

OTHER PUBLICATIONS

Qorvo, TGA2239, 13-15.5 GHz, 35 W, GaN Power Amplifier, Product Data Sheet, Rev. C, Aug. 2020 <URL: https://www.qorvo.com/products/p/TGA2239>.

CMPA1C1D060D, 60 W, 12.7-13.25 GHz, 40 V, GaN MMIC, Power Amplifier, Product Data Sheet, Rev. 0.1, Apr. 2020 <URL: https://www.wolfspeed.com/downloads/dl/file/id/947/product/223/cmpa1c1d060d.pdf>.

Takaaki Yoshioka et al. "A Ku-band 70-W Class GaN Internally Matched High Power Amplifier with Wide Offset Frequencies of up to 400 MHz for Multi-Carrier Satellite Communications," 2020 IEEE BiCMOS and Compound Semiconductor Integrated Circuits and Technology Symposium (BCICTS), Nov. 16, 2020.

International Search Report issued in PCT/JP2021/024816; mailed Sep. 21, 2021.

* cited by examiner

POWER AMPLIFIER AND RADIO FREQUENCY MODULE

FIELD

The present disclosure relates to a power amplifier and a radio frequency module.

BACKGROUND

Non Patent Literature 1 discloses an MMIC (Monolithic Microwave Integrated Circuit) formed from GaN. In the MMIC, a high output of 50 W can be realized in a Ku band.

CITATION LIST

Non Patent Literature

[NPL1] QORVO, TGA2239-CP, 13.4-15.5 GHz, 50 Watt, GaN Power Amplifier, Product Data Sheet, Rev. B, February 2021, <URL: https://www.qorvo.com/products/p/TGA2239-CP>

SUMMARY

Technical Problem

In a radio frequency module used in a small-sized earth station for satellite communication represented by 14 GHz band, a semiconductor power amplifier is generally used for a reduction in size. The radio frequency module has a high output of, for example, 40 to 100 W. Therefore, an internal matching type FET (Field Effect Transistor) is mainly adopted in a semiconductor power amplifier in a last stage of a radio frequency module transmission circuit. An internal matching type FET or an MMIC is generally used in a driver stage.

For example, when an output of the radio frequency module is 70 W, an internal matching type FET of a 70 W class is used in the last stage. In such a radio frequency module, for example, an internal matching type FET of a 50 W class that drives the internal matching type FET of the 70 W class is provided and an internal matching type FET of a 30 W class is provided in a pre-stage of the internal matching type FET of the 50 W class. An MMIC is sometimes used in an amplifier of a 30 W class.

In general, an input side and an output side of the internal matching type FET is matched to 50Ω. Therefore, a matching circuit between stages is unnecessary. However, it is conceivable that a peripheral circuit such as a bias circuit functioning as an RF (Radio Frequency)/DC (Direct Current) separation circuit or a coupling capacitor that separates bias circuits in a pre-stage and a post stage and a DC is necessary. Therefore, the size of the entire radio frequency module is likely to increase. In particular, the internal matching type FET is a one-stage amplifier having a gain of approximately 10 dB. Therefore, when the radio frequency module is multi-staged, the size of the radio frequency module is likely to markedly increase.

According to an increase in an output of an MMIC, as described in Non Patent Literature 1, a high-output MMIC of a 50 W class or a higher class is realized in the Ku band. The MMIC can be configured from a multistage amplifier. That is, a last stage and a driver stage can be integrated in one MMIC. Therefore, it is possible to reduce the radio frequency module in size. However, in particular, an SiC substrate used in a GaN-MMIC is generally extremely expensive. Therefore, manufacturing cost is likely to increase.

It is conceivable that a medium-output MMIC and a high-output internal matching type FET are combined and integrated into one package. Even in this case, a package size is likely to increase because of a matching circuit between the MMIC and the internal matching type FET.

An object of the present disclosure is to obtain a power amplifier and a radio frequency module that can be reduced in size.

Solution to Problem

A power amplifier according to the present disclosure includes an input terminal that receives a high-frequency signal from an outside, an MMIC that receives the high-frequency signal via the input terminal and amplifies the high-frequency signal, an input matching circuit, a transistor that receives, via the input matching circuit, the high-frequency signal amplified by the MMIC and amplifies the high-frequency signal, an output matching circuit, an output terminal that receives a drain voltage of the transistor from the outside, receives, via the output matching circuit, the high-frequency signal amplified by the transistor, and outputs the high-frequency signal to the outside and a drain bias circuit board that connects a drain of the transistor and a drain of the MMIC, wherein the transistor and the MMIC are conjugately matched at impedance smaller than 50Ω.

Advantageous Effects of Invention

In the power amplifier according to the present disclosure, the transistor and the MMIC are conjugately matched at impedance smaller than 50Ω. Therefore, it is possible to reduce the power amplifier in size.

DESCRIPTION OF EMBODIMENTS

Figure 1:
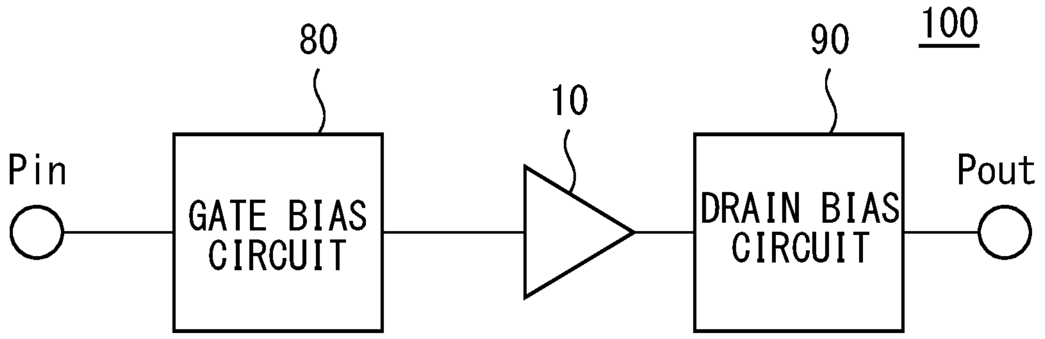
FIG. 1 is a diagram for describing a configuration of a radio frequency module according to a first embodiment.

A power amplifier and a radio frequency module according to each embodiment are described with reference to drawings. Identical or corresponding constitutional elements are given the same reference numerals, and the repeated description of such constitutional elements may be omitted.

First Embodiment

FIG. 1 is a diagram for describing a configuration of a radio frequency module 100 according to a first embodiment. The radio frequency module 100 includes a power amplifier 10, a gate bias circuit 80 that supplies a gate voltage to the power amplifier 10, and a drain bias circuit 90 that supplies a drain voltage to the power amplifier 10. The power amplifier 10 has, for example, a frequency in a Ku band and an output in a 70 W class.

Figure 2:
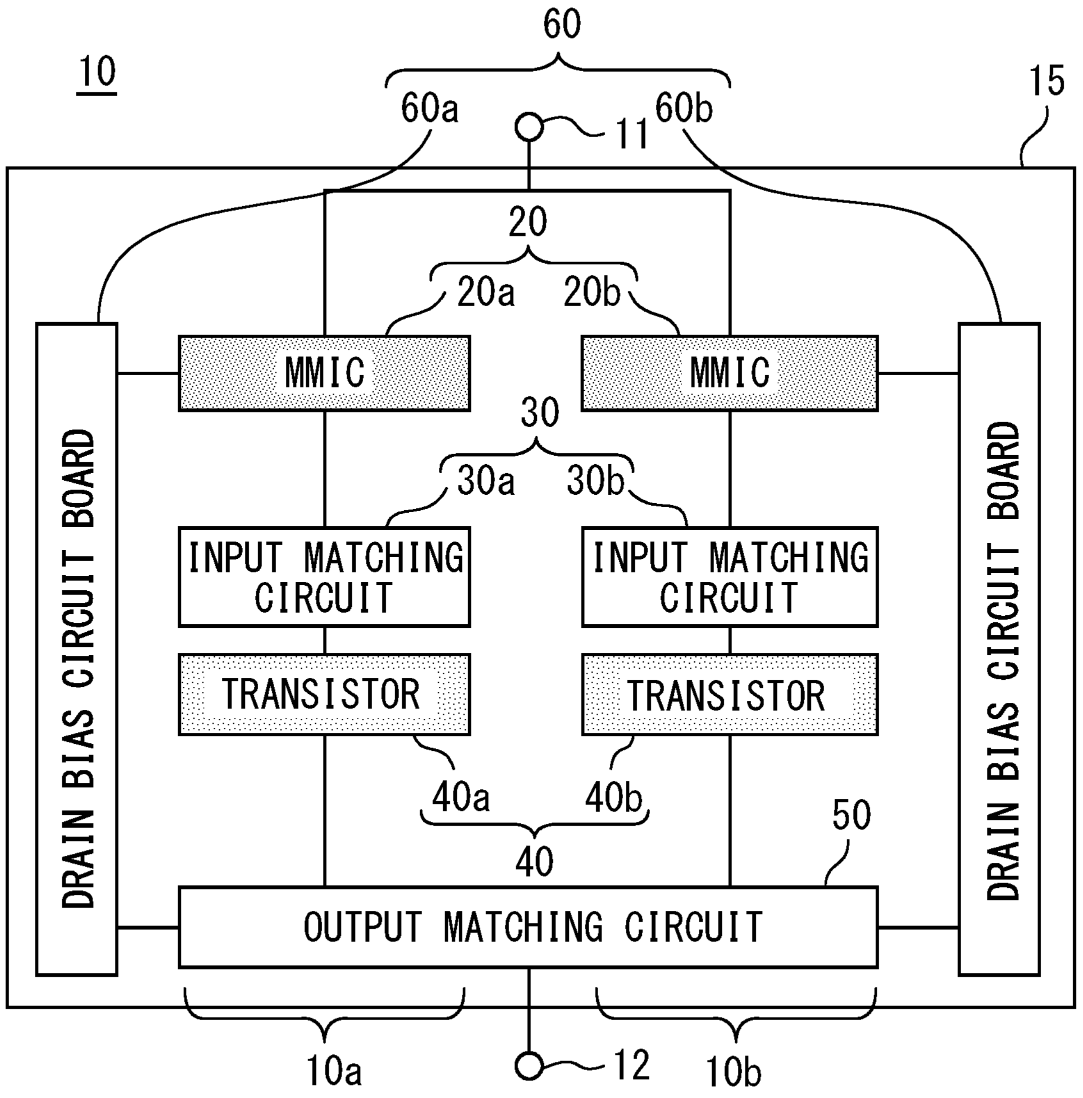
FIG. 2 is a plan view of the power amplifier according to the first embodiment.

FIG. 2 is a plan view of the power amplifier 10 according to the first embodiment. The power amplifier 10 includes only an input terminal 11 and an output terminal 12 as terminals. A high-frequency signal is input to the input terminal 11 from the outside via the gate bias circuit 80. A gate voltage of an MMIC 20 is input to the input terminal 11 from the gate bias circuit 80.

The MMIC 20 receives a high-frequency signal via the input terminal 11 and amplifiers the high-frequency signal. The power amplifier 10 includes MMICs 20*a* and 20*b* as the MMIC 20. An input matching circuit 30 is connected to an output of the MMIC 20. The power amplifier 10 includes, as the input matching circuit 30, an input matching circuit 30*a* connected to the MMIC 20*a* and an input matching circuit 30*b* connected to the MMIC 20*b*.

A transistor 40 is connected to an output of the input matching circuit 30. The transistor 40 receives, via the input matching circuit 30, the high-frequency signal amplified by the MMIC20 and amplifies the high-frequency signal. The power amplifier 10 includes, as the transistor 40, a transistor 40*a* connected to the input matching circuit 30*a* and a transistor 40*b* connected to the input matching circuit 30*b*. The transistor 40*a* amplifies the high-frequency signal amplified by the MMIC20*a*. The transistor 40*b* amplifies the high-frequency signal amplified by the MMIC20*b*. Each of the transistors 40*a* and 40*b* is one transistor chip. An output matching circuit 50 is connected to an output of the transistor 40.

The output terminal 12 receives, via the output matching circuit 50, the high-frequency signal amplified by the transistor 40 and outputs the high-frequency signal to the outside via the drain bias circuit 90. The output terminal 12 receives a drain voltage of the transistor 40 from the drain bias circuit 90.

A drain bias circuit board 60 connects a drain of the transistor 40 and a drain of the MMIC20. The power amplifier 10 includes drain bias circuit boards 60*a* and 60*b* as the drain bias circuit board 60. The drain bias circuit board 60*a* connects a drain of the transistor 40*a* and a drain of the MMIC20*a*. The drain bias circuit board 60*b* connects a drain of the transistor 40*b* and a drain of the MMIC20*b*. The drain bias circuit boards 60*a* and 60*b* are disposed on the outer side of a region where the MMICs 20*a* and 20*b* and the transistors 40*a* and 40*b* are disposed.

In the following description, a path passing through the MMIC20*a* and the transistor 40*a* from the input terminal 11 and reaching the output terminal 12 is referred to as first path 10*a*. A path passing through the MMIC20*b* and the transistor 40*b* from the input terminal 11 and reaching the output terminal 12 is referred to as second path 10*b*.

Figure 3:
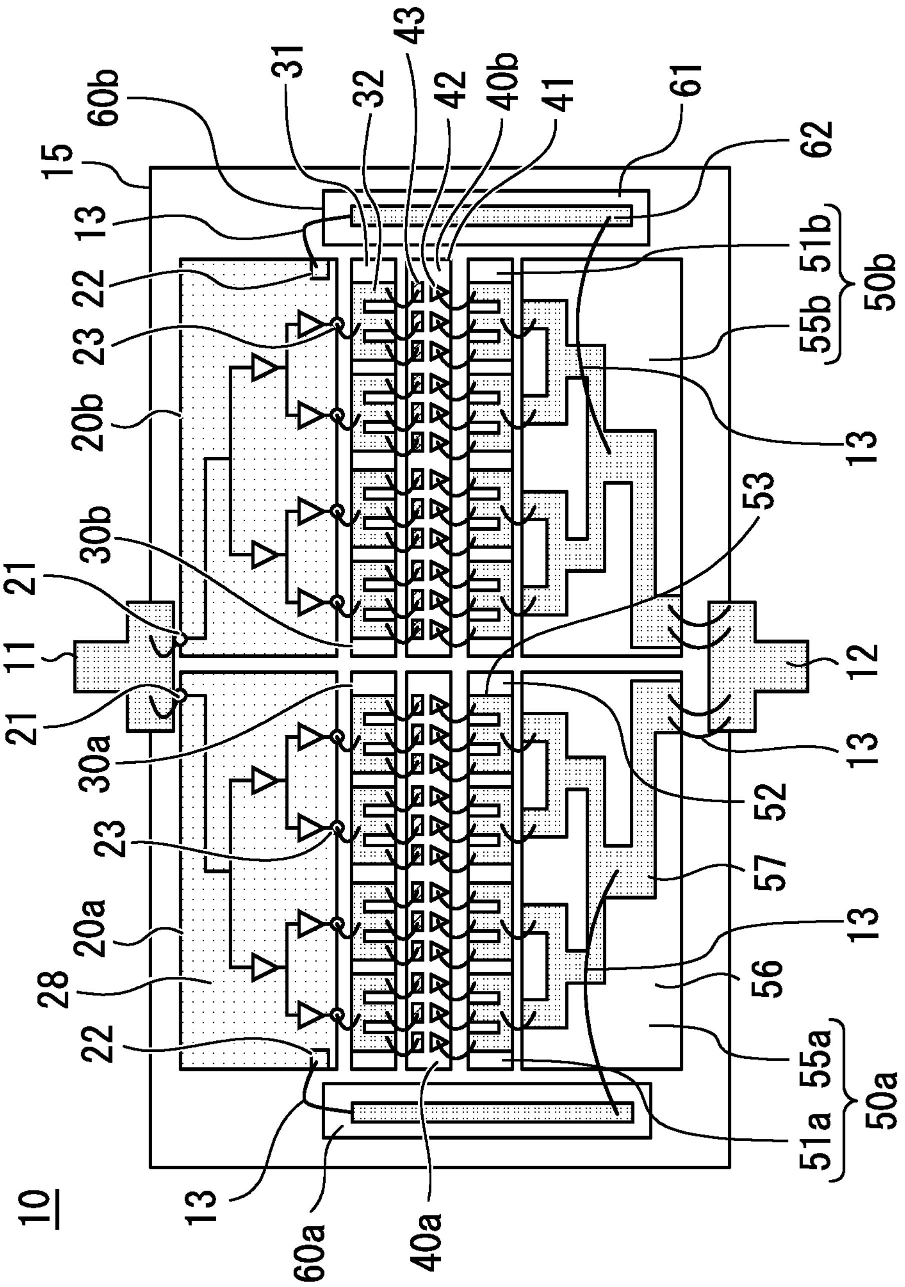
FIG. 3 is a plan view for describing a detailed configuration of the power amplifier according to the first embodiment.

FIG. 3 is a plan view for describing a detailed configuration of the power amplifier 10 according to the first embodiment. The power amplifier 10 is a three-stage amplifier. Specifically, the power amplifier 10 is configured from the MMIC 20, which is configured from amplifiers in two stages, and the transistor 40 in one stage.

The power amplifier 10 includes, as the output matching circuit 50, an output matching circuit 50*a* connected to the transistor 40*a* and an output matching circuit 50*b* connected to the transistor 40*b*. The output matching circuit 50*a* includes two types of matching circuit boards 51*a* and 55*a*. Similarly, the output matching circuit 50*b* includes two types of matching circuit boards 51*b* and 55*b*. The output matching circuits 50*a* and 50*b* combine signals input from a plurality of transistor cells 42 and output the combined signals to the output terminal 12 via a wire 13.

Each of the matching circuit boards 51*a* and 51*b* includes a substrate 52 and a pattern 53 formed on the substrate 52. In the matching circuit boards 51*a* and 51*b* connected to the transistor 40, for example, a titanium oxide substrate having a dielectric constant of approximately 40 is used as the substrate 52. In general, a line having low impedance is necessary for a matching circuit immediately following a transistor. Therefore, a low-impedance line is realized by the titanium oxide substrate having a high specific dielectric constant. A line width can be reduced by using a high-dielectric constant substrate having a specific dielectric constant of approximately 40. Therefore, a circuit size can be reduced.

Each of the matching circuit board 55*a* and 55*b* includes a substrate 56 and a pattern 57 formed on the substrate 56. For example, an alumina substrate having a dielectric constant of approximately 10 is used as the substrate 56.

In the transistors 40*a* and 40*b*, pluralities of transistor cells 42 are formed on substrates 41. The substrates 41 are, for example, SiC substrates. The transistor cells 42 are formed from, for example, a GaN-based compound semiconductor. Pre-match circuits 43 are formed on a gate side of the transistor cells 42. The pre-match circuits function as harmonic processing circuits and stabilizing circuits. Consequently, it is possible to improve efficiency of the transistor 40 and stabilize an operation of the transistor 40.

Each of the input matching circuits 30*a* and 30*b* includes a substrate 31 and a pattern 32 formed on the substrate 31. In the input matching circuit 30, signals from each output of the MMIC 20 are distributed to three transistor cells 42. The input matching circuits 30*a* and 30*b* match the MMICs 20*a* and 20*b* and the transistors 40*a* and 40*b* at 24Ω. In general, conjugate matching is performed at 50Ω in an input matching circuit. In contrast, in this embodiment, the input matching circuits 30*a* and 30*b* perform the matching at approximately half impedance of 50Ω. Note that a circuit having the same characteristics as the characteristics of the input matching circuit 30 may be formed on the transistor 40 or the MMIC 20. In this case, the input matching circuit 30 can be deleted.

Figure 4:
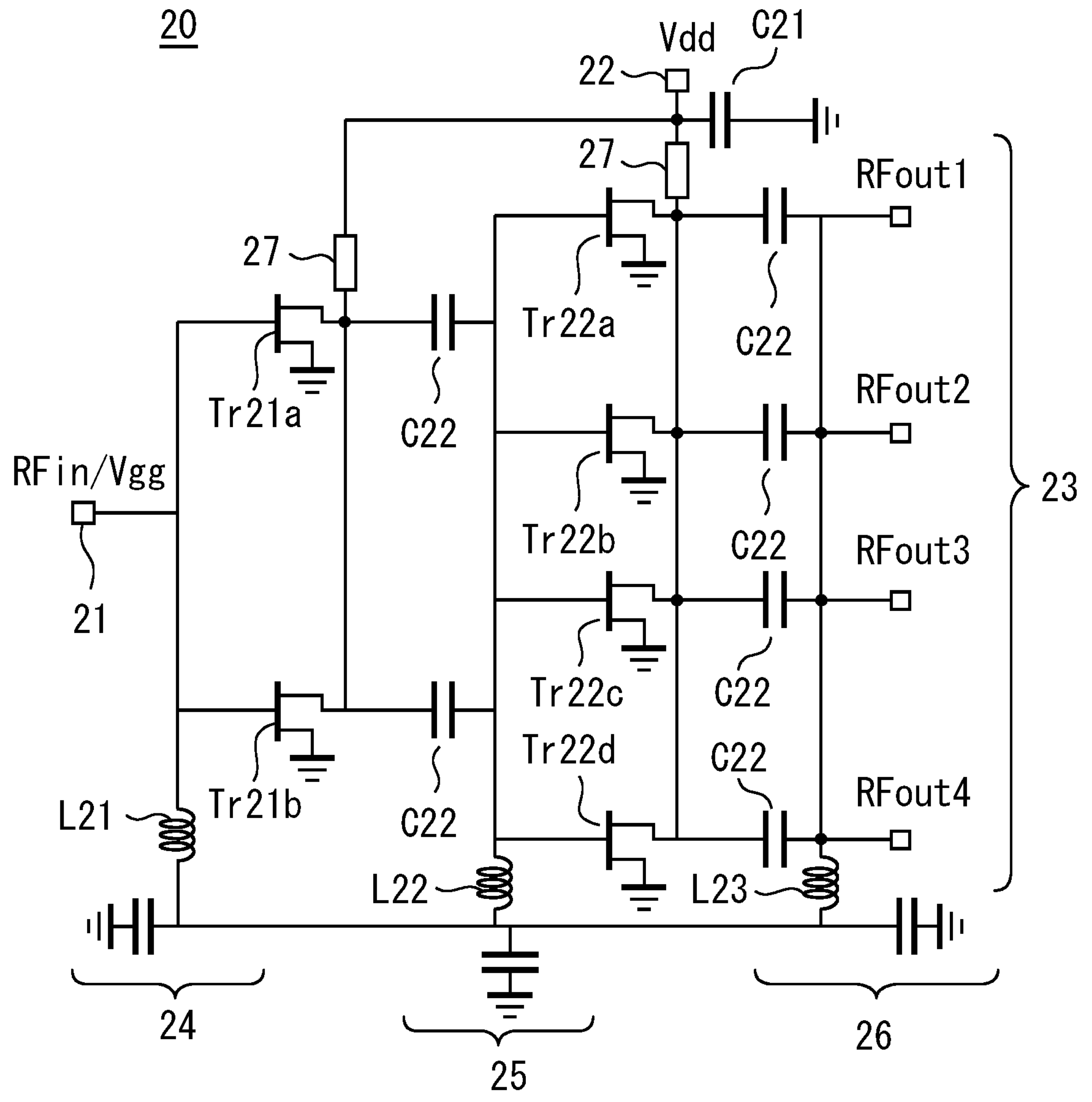
FIG. 4 is an equivalent circuit diagram of the MMIC according to the first embodiment.

The MMIC 20 includes a substrate 28 and amplifiers in two stages formed on the substrate 28. The substrate 28 is, for example, an SiC substrate. FIG. 4 is an equivalent circuit diagram of the MMIC 20 according to the first embodiment. Each of the MMICs 20*a* and 20*b* is one chip. The MMIC 20 is configured from an output side circuit 26, transistors Tr22*a* to Tr22*d* in a second stage, an inter-stage circuit 25, transistors Tr21*a* and Tr21*b* in a first stage, and an input side circuit 24. The transistors Tr21*a* and Tr21*b* and Tr22*a* to Tr22*d* are formed from, for example, a GaN-based compound semiconductor. Note that, in FIG. 4, a distributed constant line, a matching circuit, a stabilization circuit, and the like are omitted.

The output side circuit 26 is configured from a main line, a quarter wavelength line 27, which is a short stub, a capacitor C21, a capacitor C22 for coupling, and a bonding pad. The capacitor C21 is an MIM (Metal-Insulator-Metal) capacitor. The quarter wavelength line 27 electrically connects the main line and a terminal for grounding via the capacitor C21. The bonding pad includes an output pad 23 and a drain pad 22. In this embodiment, impedance is 24Ω in the output pad 23. Since the impedance of the input matching circuit 30 is also 24Ω, the MMIC 20 and the input matching circuit 30 are matched.

The inter-stage circuit 25 conjugately matches the transistors Tr22*a* to Tr22*d* in the second stage and the transistors Tr21*a* and Tr21*b* in the first stage. A matching method is a bandpass filter type. The input side circuit 24 transforms the input impedance of the transistors Tr21*a* and Tr21*b* in the first stage to 100Ω. The two MMICs 20*a* and 20*b* are connected to the input terminal 11 of a package 15 by the wire 13, whereby the input impedance of the power amplifier 10 reaches 50Ω. The input terminal 11 is called feed-through as well.

Figure 5:
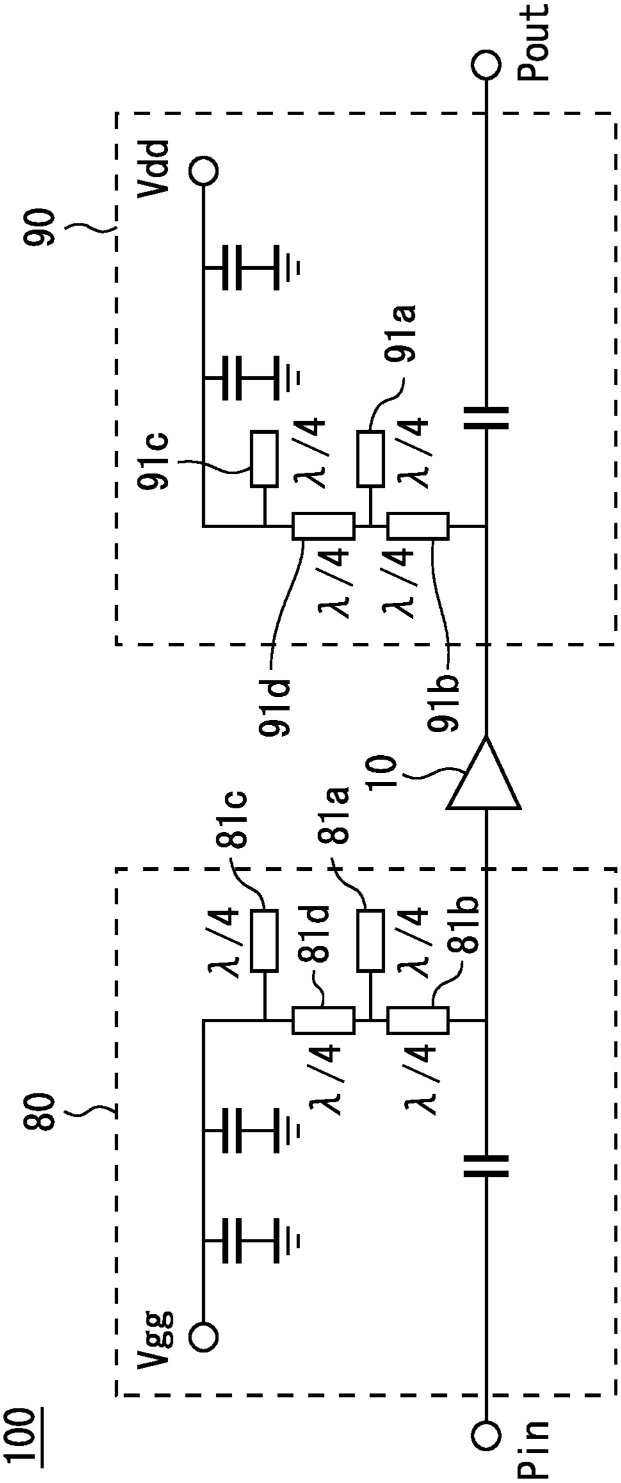
FIG. 5 is a diagram showing configurations of the gate bias circuit and the drain bias circuit according to the first embodiment.

Subsequently, the drain bias circuit 90 is described. FIG. 5 is a diagram showing configurations of the gate bias circuit 80 and the drain bias circuit 90 according to the first embodiment. In the power amplifier 10, a DC and an RF are not separated in the output terminal 12 of the package 15. Therefore, a drain voltage is fed from the output terminal 12. The drain bias circuit 90 includes a drain bias supply point Vdd for supplying a drain voltage to the output terminal 12. The drain voltage is supplied from the drain bias supply point Vdd provided on a module substrate to the output terminal 12 via quarter wavelength lines 91*b* and 91*d* and quarter wavelength open stubs 91*a* and 91*c*. The drain voltage supplied to the output terminal 12 is fed to the drain of the transistor 40 via the output matching circuit 50 as shown in FIG. 3.

Note that the impedance of the drain bias circuit 90 viewed from the main line is increased by the quarter wavelength open stub 91*a* and the quarter wavelength line 91*b*. Therefore, the influence of the drain bias circuit 90 on the main line can be suppressed. Note that the quarter wavelength open stub 91*c* and the quarter wavelength line 91*d* are provided to further increase impedance on a power supply side viewed from the main line.

Subsequently, a method of supplying a drain voltage to the MMIC 20 is described. As shown in FIG. 3, the output matching circuit 50 and the drain bias circuit board 60 are connected by the wire 13. The drain bias circuit board 60 and the drain pad 22 of the MMIC 20 are connected by the wire 13. As shown in FIG. 4, drains of the transistors Tr21*a* and Tr21*b* and Tr22*a* to Tr22*d* in the second stage and the first stage are connected to the drain pad 22 via the quarter wavelength line 27 and the capacitor C21. The capacitor C21 is called bypass capacitor as well. Consequently, the drains in all the stages are shared.

Note that the capacitor C21 is provided to suppress the influence of the drain bias circuit 90 on main circuits in the first and second stages. The capacitor C21 can also suppress the influence of the drain bias circuit 90 on a main circuit of the transistor 40. A plurality of bypass capacitors may be added on the drain bias circuit board 60. Consequently, it is possible to suppress influence on the main circuit and improve stability at a low frequency.

Figure 6:
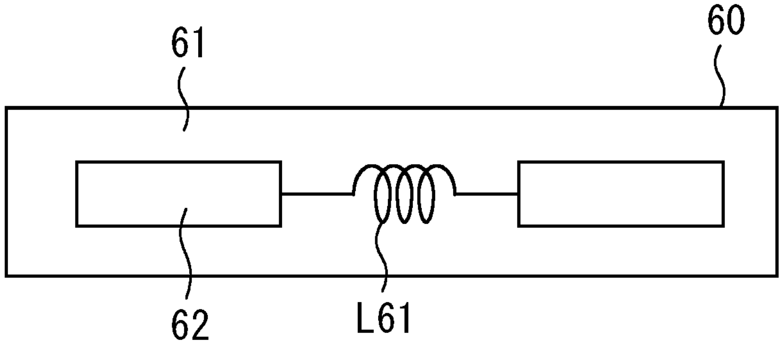
FIG. 6 is a diagram showing a configuration of the drain bias circuit board according to a modification of the first embodiment.

FIG. 6 is a diagram showing a configuration of the drain bias circuit board 60 according to a modification of the first embodiment. In the drain bias circuit board 60, a choke inductor L61 may be provided on a line 62 connecting the drain of the transistor 40 and the drain of the MMIC 20. Consequently, a loop to the drain bias circuit 90 can be cut off. Note that, in the drain bias circuit board 60, at least the line 62 connecting the drain of the transistor 40 and the drain of the MMIC 20 only has to be provided on a substrate 61.

The substrate 61 of the drain bias circuit board 60 may be an inexpensive resin substrate. An IPD (Integrated Passive Device) formed on a substrate of Si, GaAs, glass, or the like may be used as the drain bias circuit board 60.

Subsequently, the gate bias circuit 80 is described. A configuration of the gate bias circuit 80 is the same as the configuration of the drain bias circuit 90. As shown in FIG. 5, a gate voltage is supplied from a gate bias supply point Vgg provided on a module substrate to the input terminal 11 of the package 15 via quarter wavelength lines 81*b* and 81*d* and quarter wavelength open stubs 81*a* and 81*c*. The input terminal 11 is connected to an input pad 21 of the MMIC 20 via the wire 13.

A capacitor for coupling is not provided in the input side circuit 24 of the MMIC20. Therefore, the gate voltage input to the input pad 21 is fed to gates of the transistors Tr21*a* and Tr21*b* in the first stage. In the transistors Tr22*a* to Tr22*d* in the second stage, the gate voltage is fed via choke inductors L21 and L22 formed on the MMIC20. In the transistor 40, the gate voltage is fed to gates of the transistor cells 42 via choke inductors L21 and L23, the output pad 23, the wire 13, the input matching circuit 30, and the pre-match circuits 43.

Figure 7:
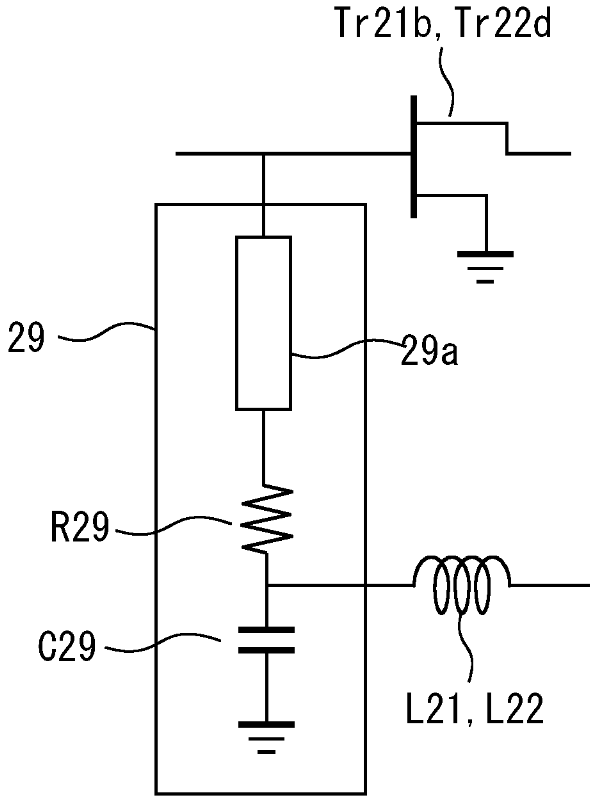
FIG. 7 is a diagram showing a stabilization circuit according to the first embodiment.

Note that bypass capacitors for oscillation suppression may be provided in the choke inductors L21, L22, and L23. FIG. 7 is a diagram showing a stabilization circuit 29 according to the first embodiment omitted in FIG. 4. The stabilization circuit 29 functions as a matching circuit as well. The stabilization circuit 29 includes, for example, a line for matching 29*a*, a resistor R29, and a bypass capacitor C29. The positions of the choke inductors L21 and L22 may not be on the main line but may be the front of the bypass capacitor C29 of the stabilization circuit 29 as shown in FIG. 7.

Figure 8:
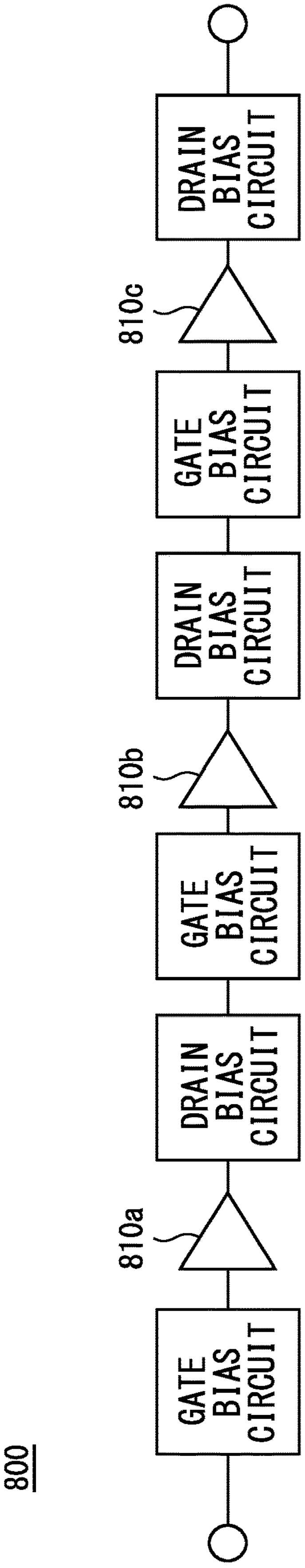
FIG. 8 is a diagram for describing a configuration of a radio frequency module according to a comparative example of the first embodiment.

FIG. 8 is a diagram for describing a configuration of a radio frequency module 800 according to a comparative example of the first embodiment. An output of the radio frequency module 800 is 70 W. In the radio frequency module 800, an internal matching type FET 810*c* of a 70 W class is used in a last stage. Further, in order to drive the internal matching type FET 810*c*, an internal matching type FET 810*b* of a 50 W class and an internal matching type FET 810*a* of a 30 W class are provided.

An input side and an output side of each of the internal matching type FETs 810*a* to 810*c* is matched to 50Ω. Therefore, a matching circuit between stages is unnecessary. However, in such a configuration, each stage requires a gate bias circuit, a drain bias circuits, and the like. The radio frequency module 800 is likely to increase in size. In particular, an internal matching type FET is generally a one-stage amplifier having a gain of approximately 10 dB. Therefore, when the radio frequency module 800 is multi-staged using the internal matching type FET, the radio frequency module 800 is likely to markedly increase in size.

In contrast, in this embodiment, a multistage amplifier can be configured by the package 15 including only two terminals as in the internal matching type FET. In this embodiment, the multistage amplifier has a gain of, for example, approximately 30 dB and is capable of outputting electric power of a 70 W class. For this reason, the radio frequency module 100 can be configured by one power amplifier 10. Therefore, the radio frequency module 100 can be reduced in size. The radio frequency module 100 can be manufactured at low cost.

In the power amplifier 10, the multistage amplifier is housed in one package. Therefore, it is possible to improve a gain compared with when a plurality of internal matching type FETs are used as shown in FIG. 8.

In this embodiment, since a two-terminal package can be used, altered design from a conventional radio frequency module is easy. A package of the same type as a product group that has been conventionally used can be used as the package 15. As an inspection jig and an evaluation jig during manufacturing, an inspection jig and an evaluation jig used for conventional products can be used. Therefore, initial cost such as procurement cost and running cost can be reduced.

In this embodiment, the low-output small GaN-MMIC 20 and the high-output transistor 40 configured from necessary minimum circuits are combined to configure the power amplifier 10. Therefore, it is possible to suppress manufacturing cost compared with when all circuits in all stages are configured by GaN-MMICs. That is, it is possible to minimize use of an expensive SiC substrate necessary for a GaN-HEMT. In general, a multi-pin package is adopted in an MMIC. In contrast, in this embodiment, the two-terminal package can be used as described above.

In this embodiment, the impedance between stages is not matched to 50Ω. The output side impedance of the MMIC 20 is low impedance in the Ku band. For this reason, the input matching circuit 30 can easily perform matching by performing matching at 24Ω close to the output side impedance of the MMIC 20. Since the input matching circuit 30 does not perform matching at 50Ω, the input matching circuit 30 can be reduced in size. Therefore, the power amplifier 10 and the radio frequency module 100 can be reduced in size. Since the input matching circuit 30 can be simplified, it is possible to improve a gain through a reduction in a matching circuit loss. It is possible to expand a band of the power amplifier 10. Since a loss of the input matching circuit 30 decreases, it is possible to reduce an output of the MMIC 20. Therefore, a low distortion characteristic can be obtained.

In this embodiment, as an example, the transistor 40 and the MMIC 20 are conjugately matched at 24Ω. Not only this, but the transistor 40 and the MMIC 20 only have to be conjugately matched at impedance smaller than 50Ω.

In this embodiment, the drain bias circuit boards **60*a* and 60*b* are disposed on both sides of the package 15. In this configuration, a drain current of the MMIC 20 is dispersed by the two drain bias circuit boards 60*a* and 60*b*. Accordingly, the wiring width of the drain bias circuit boards 60*a* and 60*b* can be reduced. Therefore, the line 62 having high impedance can be realized and it is possible to improve isolation of the drain of the transistor 40 and the drain of the MMIC 20**. For this reason, it is possible to improve stability and suppress unnecessary oscillation.

In FIG. 3, signals from the output matching circuits **50*a* and 50*b* on the left and the right are combined in the output terminal 12 via the wire 13. As this modification, as shown in FIG. 2, signals of the first path 10*a* and the second path 10*b* may be combined on one output matching circuit 50. In this case, since the signals can be combined not via the wire 13**, the length of which easily varies, it is possible to suppress manufacturing variation.

The transistor 40 in this embodiment is, as an example, a GaN transistor formed on an SiC substrate. Not only this, but the transistor 40 may be a GaAs transistor. The transistor 40 may be formed on an Si substrate, a GaN substrate, or a diamond substrate. The power amplifier 10 may be a Doherty amplifier.

These modifications can be applied, as appropriate, to power amplifiers and radio frequency modules according to the following embodiments. Note that the power amplifiers and the radio frequency modules according to the following embodiments are similar to those of the first embodiment in many respects, and thus differences between the power amplifiers and the radio frequency modules according to the following embodiments and those of the first embodiment will be mainly described below.

Second Embodiment

Figure 9:
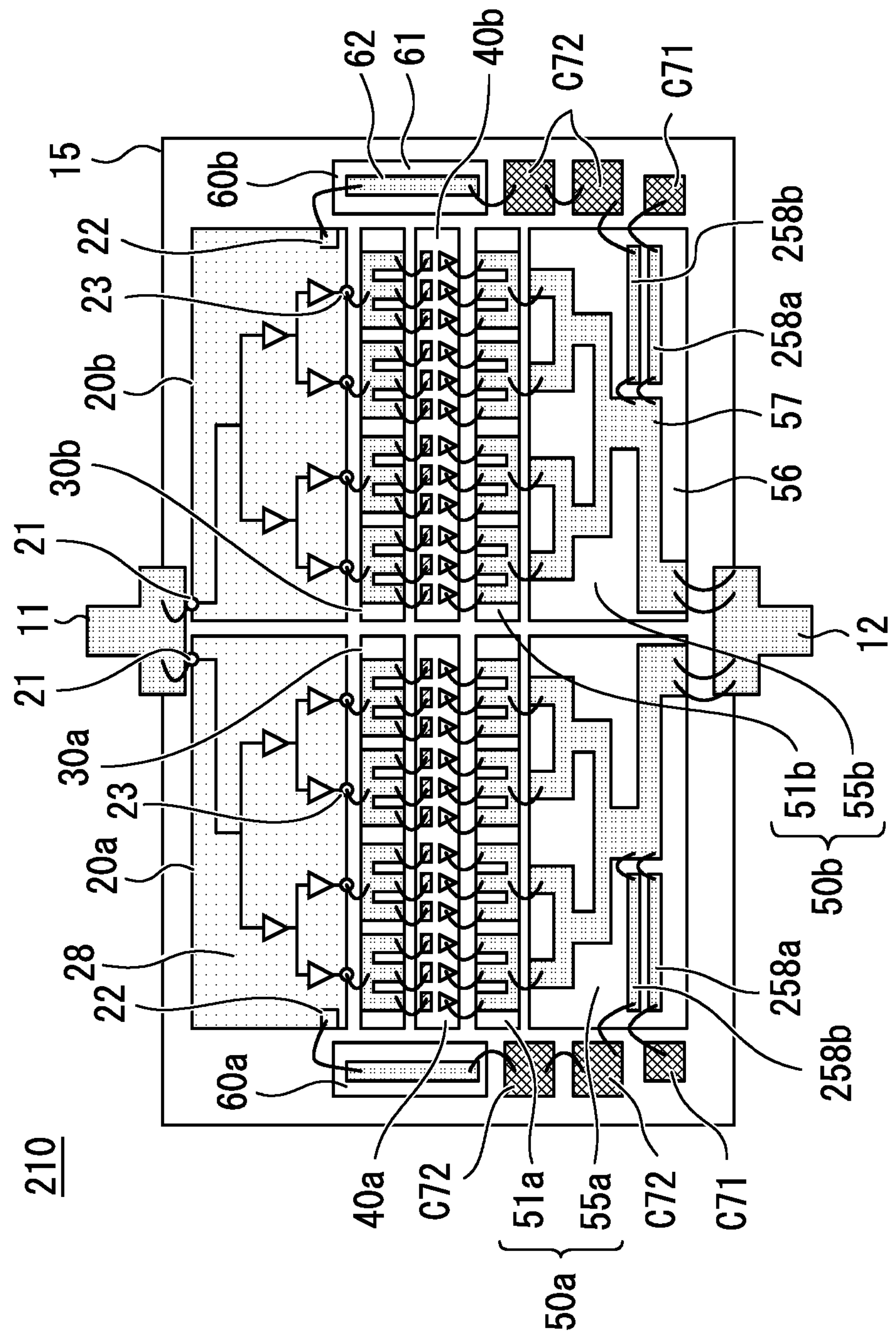
FIG. 9 is a plan view of a power amplifier according to a second embodiment.

FIG. 9 is a plan view of a power amplifier 210 according to a second embodiment. In this embodiment, a path connecting the drain of the transistor 40 and the drain of the MMIC 20 via the drain bias circuit board 60 is connected to a terminal for grounding by capacitors C71 and C72. The capacitors C71 and C72 have a capacity with which impedance viewed from the transistor 40 is 50Ω or less with respect to a difference frequency of the high-frequency signal amplified by the transistor 40.

Short stubs **258*a* and 258*b* are provided on the path connecting the drain of the transistor 40 and the drain of the MMIC 20 via the drain bias circuit board 60. The short stubs 258*a* and 258*b* are provided on the substrate 56 and have line length that is a quarter of a wavelength of the high-frequency signal amplified by the transistor 40. The short stub 258*a* is connected between the capacitor C71 and the pattern 57 and connected to a terminal for grounding via the capacitor C71. The short stub 258*b* is connected between the capacitor C72 and the pattern 57 and connected to the terminal for grounding via the capacitor C72. The line 62 of the drain bias circuit board 60 has line length that is a quarter of a wavelength of the high-frequency signal amplified by the transistor 40. The other components are the same as the components of the power amplifier 10**.

The short stubs **258*a* and 258*b* and the capacitors C71 and C72** configure difference frequency short circuits. A difference frequency is described. When fundamental wave signals of two waves having frequencies f1 and f2 are input to a transistor, distortion components occur at difference frequencies |f2-f1| and |f1-f2|. Through mixing of the distortion components and the fundamental wave signals, distortion components of 2f2-f1 and 2f1-f2 occur near the frequencies f1 and f2 of the fundamental wave signals. Those are called IMD3 (3rd Intermodulation Distortion).

Since the frequencies of the IMD3 are close to the frequencies of the fundamental wave signals, communication quality is sometimes greatly deteriorated if the IMD3 is large. Therefore, in general, the power amplifier is required to minimize the IMD3. For example, in the case of a power amplifier for satellite communication, if fundamental waves have f1=14.00 GHz and f2=14.01 GHz, a difference frequency is Δf=10 MHz. At this time, the IMD3 is required to be, for example, −25 dBc or less with respect to the fundamental wave signals. In addition, in recent years, multicarrier communication is actively performed in order to expand a communication capacity. At this time, a wideband difference frequency characteristic with a difference frequency of several MHz to 400 MHz is sometimes required.

The difference frequency short circuit is provided to suppress the IMD3. The difference frequency short circuits in this embodiment are configured by adding the capacitors C71 and C72, which are chip capacitors, to the distal ends of the short stubs 258*a* and 258*b* having electrical length that is a quarter of a wavelength with respect to a fundamental wave of a main signal. To suppress a differential frequency, it is desirable that impedance for the difference frequency is short-circuited at a drain end of the transistor 40. Therefore, a capacitor having a high resonance frequency is used for the capacitors C71 and C72 such that the impedance is short-circuited with respect to the difference frequency.

It is desirable that the difference frequency short circuit does not affect an RF characteristic of the fundamental wave. In this embodiment, the impedance of the short stubs 258*a* and 258*b* is open for the fundamental wave. Therefore, it is possible to suppress the influence of the short stubs 258*a* and 258*b* on a fundamental wave characteristic.

When the difference frequency is suppressed in a wideband, it is effective to use a plurality of capacitors such that the impedance viewed from the drain end of the transistor 40 is short-circuited or to be low impedance equal to or lower than 50Ω with respect to a desired difference frequency. For example, when the difference frequency is short-circuited in a range of 1 MHz to 375 MHz, it has been found that it is desirable to install three sets of capacitors and short stubs in an output side circuit of the transistor 40. For example, it is desirable to select three chip capacitors such that the impedance is 50Ω or less at 157 MHz, 27 MHz, and 5 MHz. Consequently, it is possible to reduce the impedance for the difference frequency over the wideband.

Figure 10:
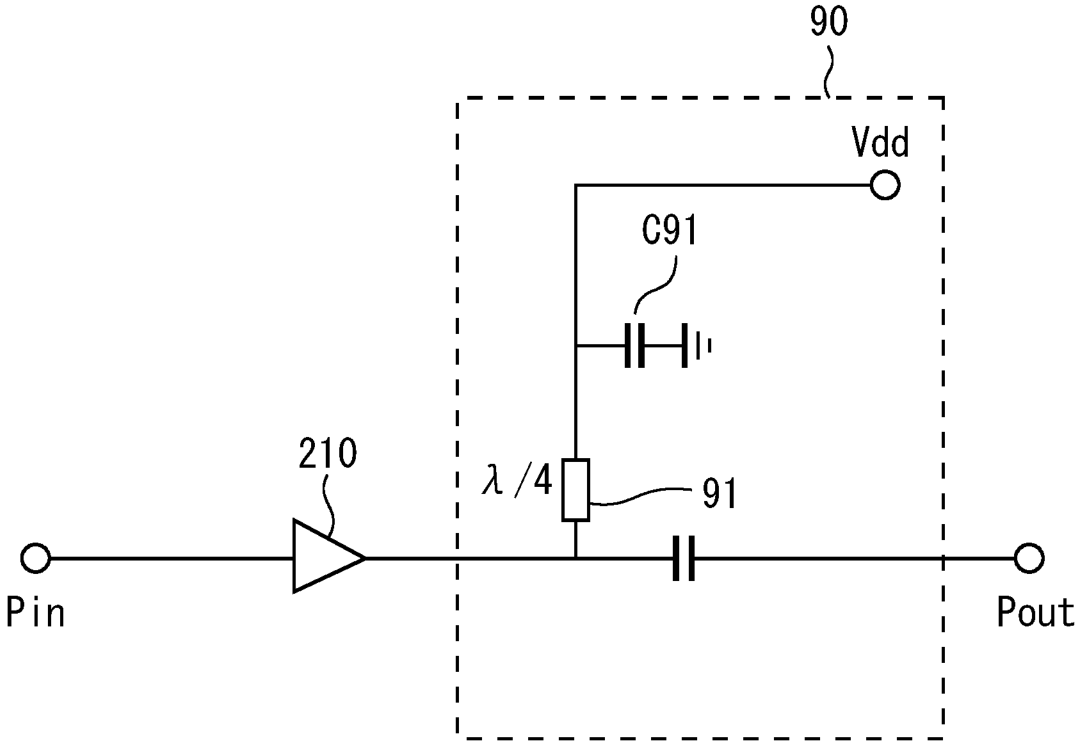
FIG. 10 is a diagram showing a configuration of the drain bias circuit according to the second embodiment.

In this embodiment, the two sets of short stubs 258*a* and 258*b* and capacitors C71 and C72 are provided in the power amplifier 210. Note that, in FIG. 9, two capacitors C72 are connected to one short stub 258*a*. However, since an object of the two capacitors C72 is to short-circuit the same frequency, the two capacitors C72 is counted as one. As shown in FIG. 10, a third set of difference frequency short circuits is provided in the drain bias circuit 90.

FIG. 10 is a diagram showing a configuration of the drain bias circuit 90 according to the second embodiment. In the drain bias circuit 90, a short stub 91 and a capacitor C91 connected to the distal end of the short stub 91 are provided as the third set of difference frequency short circuits. The short stub 91 has line length that is a quarter of a wavelength of the high-frequency signal amplified by the transistor 40. A path connecting the drain bias supply point Vdd and the output terminal 12 is connected to the terminal for grounding by the capacitor C91. The capacitor C91 has a capacity with which impedance viewed from the transistor 40 is 50Ω or less with respect to a difference frequency of the high-frequency signal amplified by the transistor 40.

From the above, in this embodiment, the difference frequency can be suppressed in a wideband by the three sets of difference frequency short circuits. The short stubs 258*a*, 258*b*, and 91 form a quarter wavelength line in the Ku band. Therefore, it is possible to suppress the influence of the difference frequency short circuits on a main circuit in a last stage in the Ku band. Note that the capacitor C71 is for 157 MHz, the capacitor C72 is for 27 MHz, and the capacitor C91 is for 5 MHz.

In this embodiment, the third difference frequency short circuit is provided on a module substrate to be housed in the existing package 15. Note that a difference frequency short circuit for 5 MH functions as a drain bias circuit as well.

Here, in general, a GaN-based amplifier has an unsatisfactory distortion characteristic compared with a GaAs-based amplifier. Therefore, in a multistage amplifier including a GaN transistor, distortion that occurs in a driver stage sometimes cannot be neglected. If the IMD3 in the driver stage is suppressed, the IMD3 of the entire amplifier can be reduced. Therefore, it is desirable that a difference frequency short circuit is provided in the drive stage as well.

In other words, it is preferable to short-circuit difference frequencies using capacitors for the transistors Tr21*a*, Tr21*b*, and Tr22*a* to Tr22*d* in the first and second stages as well. For example, it is desirable to install a short stub, to the distal end of which a capacitor is connected, on the MMIC 20. This difference frequency short circuit is connected to drains of the transistors Tr21*a*, Tr21*b*, and Tr22*a* to Tr22*d*. As the difference frequency short circuit, for example, the quarter wavelength line 27 and the capacitor C21 can be used.

The drains of the transistors Tr21*a*, Tr21*b*, and Tr22*a* to Tr22*d* are connected to the capacitors C71, C72, and C91 via the drain bias circuit board 60 on the outer side of an MMIC chip. In this embodiment, the line length of the drain bias circuit board 60 is a quarter wavelength. Therefore, the impedance on the outer side from the drain pad 22 is high with respect to the fundamental wave. It is possible to prevent the drain bias circuit board 60 from affecting an RF characteristic of the driver stage. In this way, the drain bias circuit board 60 can be used as the difference frequency short circuit in the driver stage.

Note that, when the power amplifier 210 has a loop gain specific to the multistage amplifier, a choke inductor may be installed at a wiring end on the opposite side of the capacitor C72 of the drain bias circuit board 60.

In this embodiment, the difference frequency can be short-circuited in the wideband in the transistor not only in the last stage but also in the driver stage. Therefore, it is possible to realize a low distortion characteristic in the entire power amplifier 210.

When the difference frequency is short-circuited by the three-stage amplifier shown in FIG. 8, three sets of short stubs are used per one stage. Therefore, nine sets of short stubs are necessary in the three-stage amplifier. A circuit size is likely to increase. If the multistage amplifier is configured by one package 15 as in this embodiment, it is conceivable that it is difficult to secure a space for installing the difference frequency short circuit for the driver stage. When the difference frequency short circuit for the driver stage is provided on the outer side of the package 15, it is necessary to separately provide a drain terminal of the driver stage in the package 15. Therefore, the number of terminals is likely to increase. The circuit size of the module substrate is likely to increase because the difference frequency short circuit is provided.

In contrast, in this embodiment, the area of the difference frequency short circuit can be suppressed by utilizing the drain bias circuit board 60. It is unnecessary to separately provide the difference frequency short circuit for the driver stage on the module substrate. The circuit size of the module substrate can be suppressed. An increase in the number of terminals of the package 15 can be suppressed.

In this embodiment, the drain bias circuit boards 60*a* and 60*b* are disposed on both sides of the package 15. Consequently, the short stubs 258*a* and 258*b* can be easily laid out.

Note that, in this embodiment, a short stub for 5 MHz having a low frequency is installed on the module substrate because of a circuit size. Not only this, but all difference frequency short circuits may be disposed in the power amplifier 210.

Third Embodiment

Figure 11:
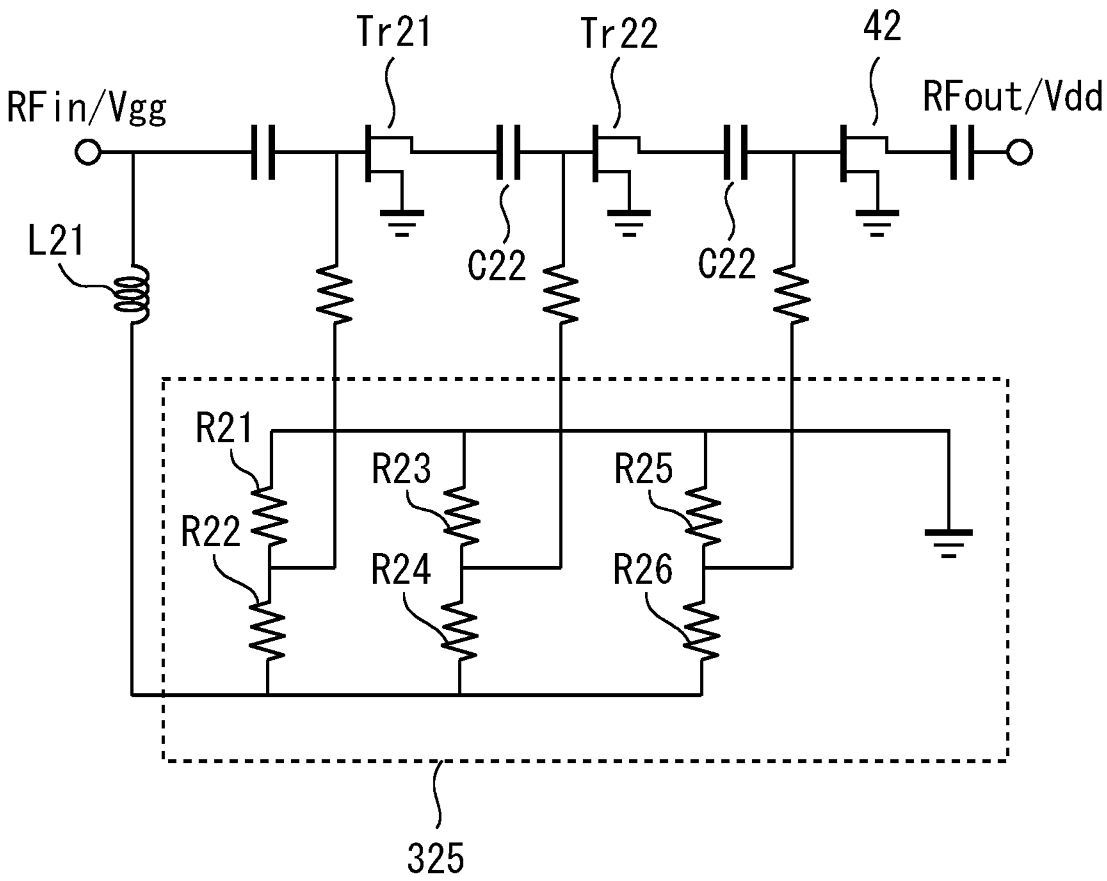
FIG. 11 is an equivalent circuit diagram of a voltage divider circuit according to a third embodiment.

FIG. 11 is an equivalent circuit diagram of a voltage divider circuit 325 according to a third embodiment. The MMIC 20 includes the voltage divider circuit 325 that divides a gate voltage input from the outside via the input terminal 11. Voltages obtained by dividing the gate voltage are supplied to gates of the transistors Tr21*a*, Tr21*b*, and Tr22*a* to Tr22*d*, which are the amplifiers in the MMIC 20, or a gate of the transistor 40 by the voltage divider circuit 325. Note that, in FIG. 11, for convenience, the MMIC 20 and the transistor 40 are simplified and shown. In FIG. 11, a transistor Tr21 corresponds to the transistors Tr21*a* and Tr21*b* and a transistor Tr22 corresponds to the transistors Tr22*a* to Tr22*d*.

The voltage divider circuit 325 includes resistors R21 to R26. Gate voltages supplied to the transistors in the stages are determined by resistance values of the resistors R21 to R26. Therefore, different gate voltages can be applied for each of the stages. For example, a voltage supplied from the voltage divider circuit 325 to the gates of the transistors Tr21 and Tr22 in the MMIC 20 and a voltage supplied from the voltage divider circuit 325 to the gate of the transistor 40 may be different. With this configuration, it is possible to use different types of transistors in the power amplifier 10.

For example, the transistors Tr21 and Tr22 in the MMIC 20 may be formed on an Si substrate and the transistor 40 may be formed on an SiC substrate. Specifically, a GaN transistor formed on an SiC substrate in which a satisfactory RF characteristic can be obtained is used in the last stage and a GaN transistor formed on an inexpensive Si substrate for a cost reduction is used in the driver stage. Consequently, it is possible to suppress cost while securing an RF characteristic. For improvement of a distortion characteristic or reliability, in some case, epitaxial structures are different in a transistor on an SiC substrate and a transistor on an Si substrate and optimum gate voltages are different. According to this embodiment, it is possible to feed optimum gate biases to transistors formed on different substrates. Note that optimum drain voltages are sometimes different in the transistor Tr21 and Tr22 on the Si substrate and the transistor 40 on the SiC substrate. In this case, the inductor L61 shown in FIG. 6 may be replaced with a resistor. Alternatively, a resistor may be added in series to the inductor L61 on the line 62. Consequently, it is possible to feed optimum drain voltages to the transistors Tr21 and Tr22 according to a voltage drop of a resistor on the drain bias circuit board 60.

It has been found that, in a relation between a gain and input power, whether to compress or expand the gain depends on gm3, which is third differential of a drain current by a gate voltage. The relation between the gain and the input power is called AM-AM characteristic as well and greatly affects the IMD3. Here, the gain compression indicates that the gain decreases with respect to the input power and the gain expansion indicates that the gain increases with respect to the input power. The gain is expanded when gm3>0 and the gain is compressed when gm3<0. The gm3 depends on the gate voltage. Therefore, it is possible to control, with the gate voltage, whether to expand the gain or compress the gain.

In this embodiment, a voltage with which the gain decreases with respect to the input power may be supplied to one of the transistors Tr21, Tr22 in the MMIC 20 and the transistor 40 from the voltage divider circuit 325 and a voltage with which the gain increases with respect to the input power may be supplied to the other from the voltage divider circuit 325. For example, a gate voltage with which the gain is expanded is supplied to the transistor 40 and a gate voltage with which the gain is compressed is supplied to the transistors Tr21 and Tr22. At this time, the AM-AM characteristic is opposite characteristics in the MMIC 20 and the transistor 40. That is, AM-AM is offset in the entire power amplifier 10. Consequently, it is possible to improve the IMD3. In this case, it is premised that transistors in the same process are used in all the stages.

The resistors R21 to R26 may be set to a value lower than a target value in advance. Consequently, even when characteristic variation for each of manufacturing lots is large, it is possible to improve the RF characteristic by laser-trimming the resistors R21 to R26. It is possible to manufacture the power amplifier 10 at high yield. The voltage divider circuit 325 may be provided in other than the MMIC 20 in the power amplifier 10. The voltage divider circuit 325 may be one chip.

Fourth Embodiment

Figure 12:
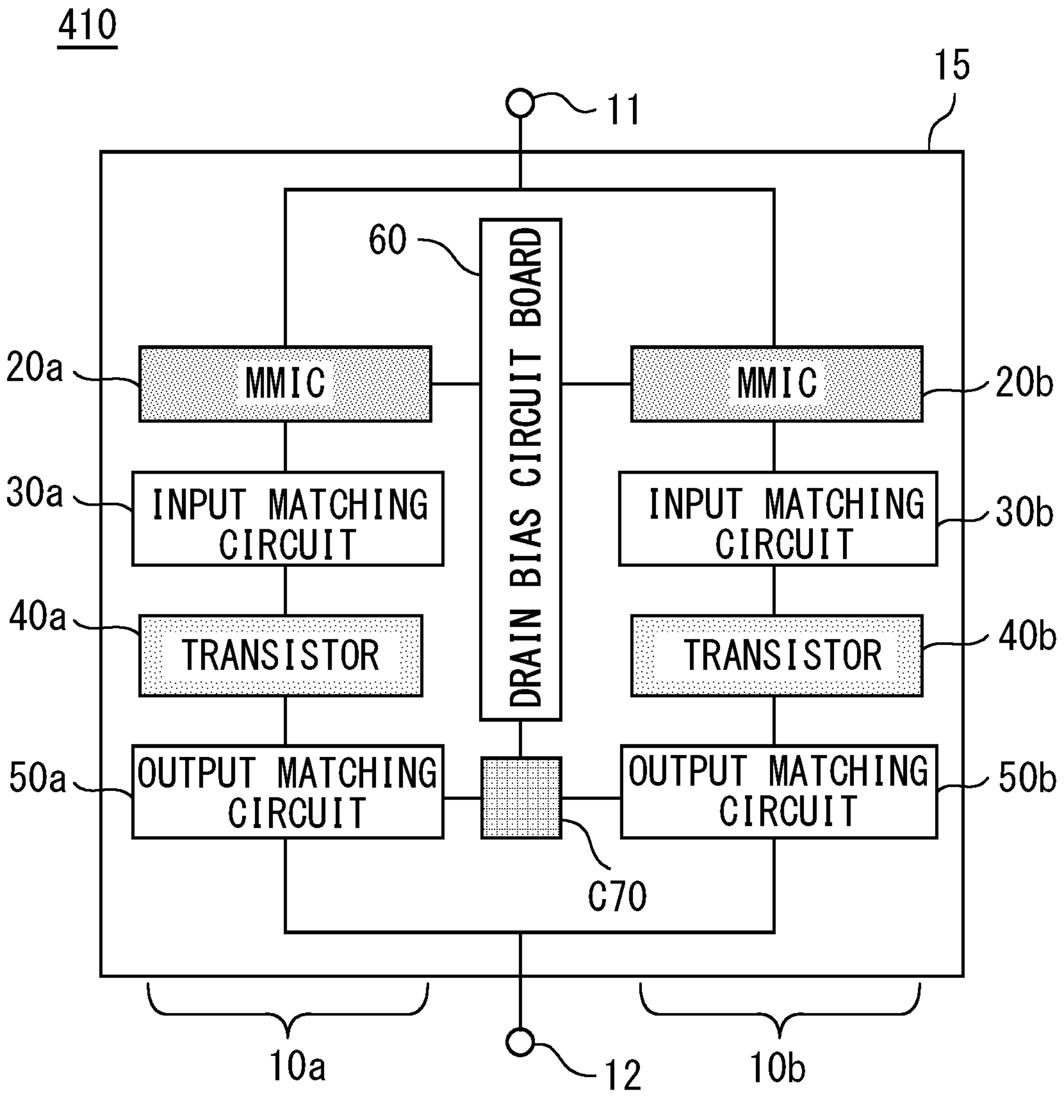
FIG. 12 is a plan view of a power amplifier according to a fourth embodiment.

FIG. 12 is a plan view of a power amplifier 410 according to a fourth embodiment. In this embodiment, the drain bias circuit board 60 is disposed between the first path 10*a* and the second path 10*b*. In this embodiment, the drain bias circuit board 60 is shared by the first path 10*a* and the second path 10*b*. As a capacitor for difference frequency short circuit, a capacitor C70 shared by the first path 10*a* and the second path 10*b* may be disposed between the first path 10*a* and the second path 10*b*. Consequently, it is possible to reduce the number of components and reduce material cost and assembly cost.

Fifth Embodiment

Figure 13:
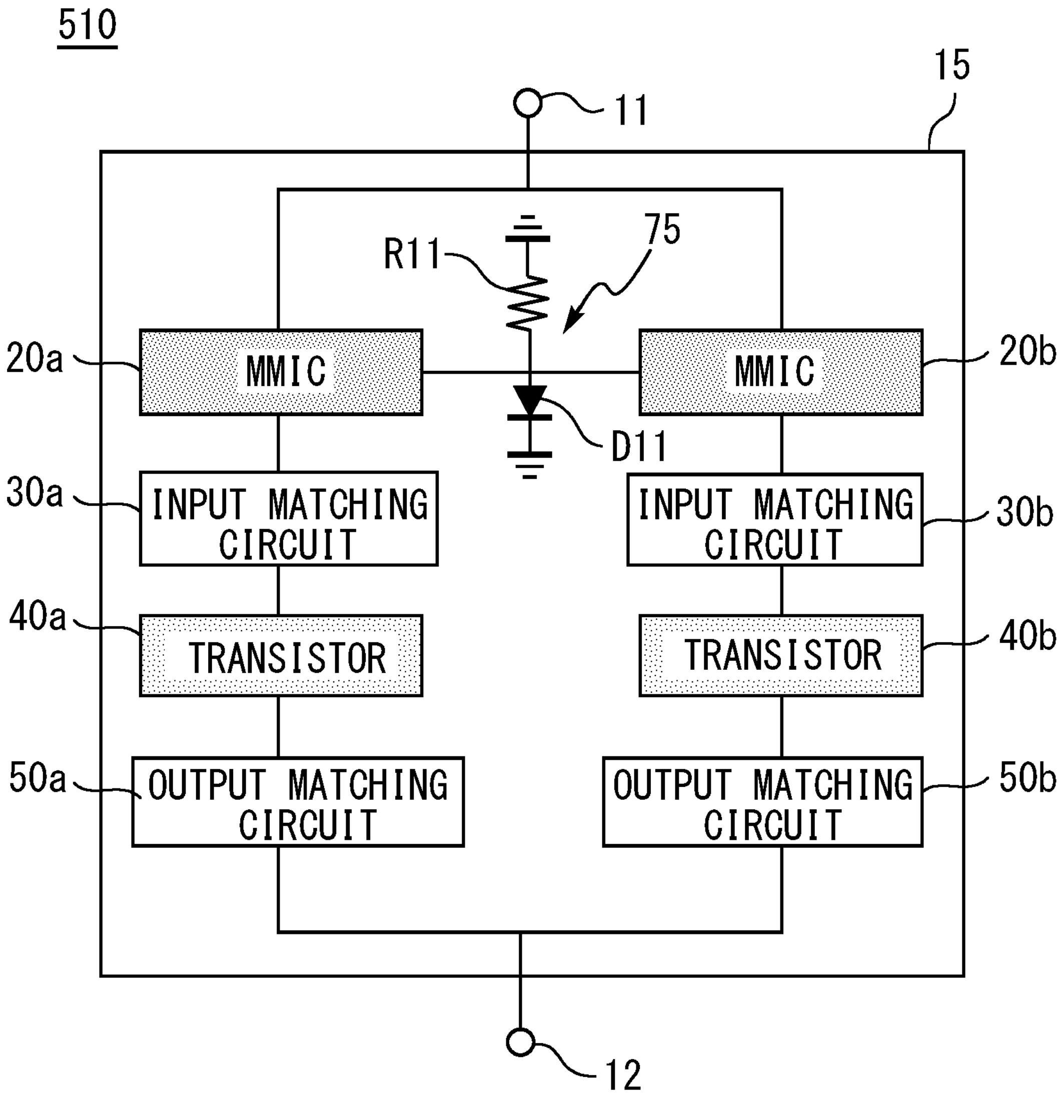
FIG. 13 is a plan view of a power amplifier according to a fifth embodiment.

FIG. 13 is a plan view of a power amplifier 510 according to a fifth embodiment. The power amplifier 510 includes a diode linearizer 75 disposed between the first path 10*a* and the second path 10*b*. In the diode linearizer 75, an anode of a diode D11 is connected to a terminal for grounding via a resistor R11. Note that, in FIG. 13, the drain bias circuit board 60 is omitted.

Consequently, it is possible to dispose the diode linearizer 75 without increasing the package 15 in size. Therefore, it is possible to greatly improve a distortion characteristic. In this case, a bias terminal of the diode linearizer 75 is made unnecessary by grounding an anode of the diode D11. Therefore, the number of terminals of the package 15 can be maintained at two.

The diode D11 is desirably connected in parallel to a pre-stage of the first stage of the MMIC 20. When the diode D11 is connected to a post stage of the transistor 40 or the like after amplification of electric power, the diode D11 having large withstand power is necessary.

Figure 14:
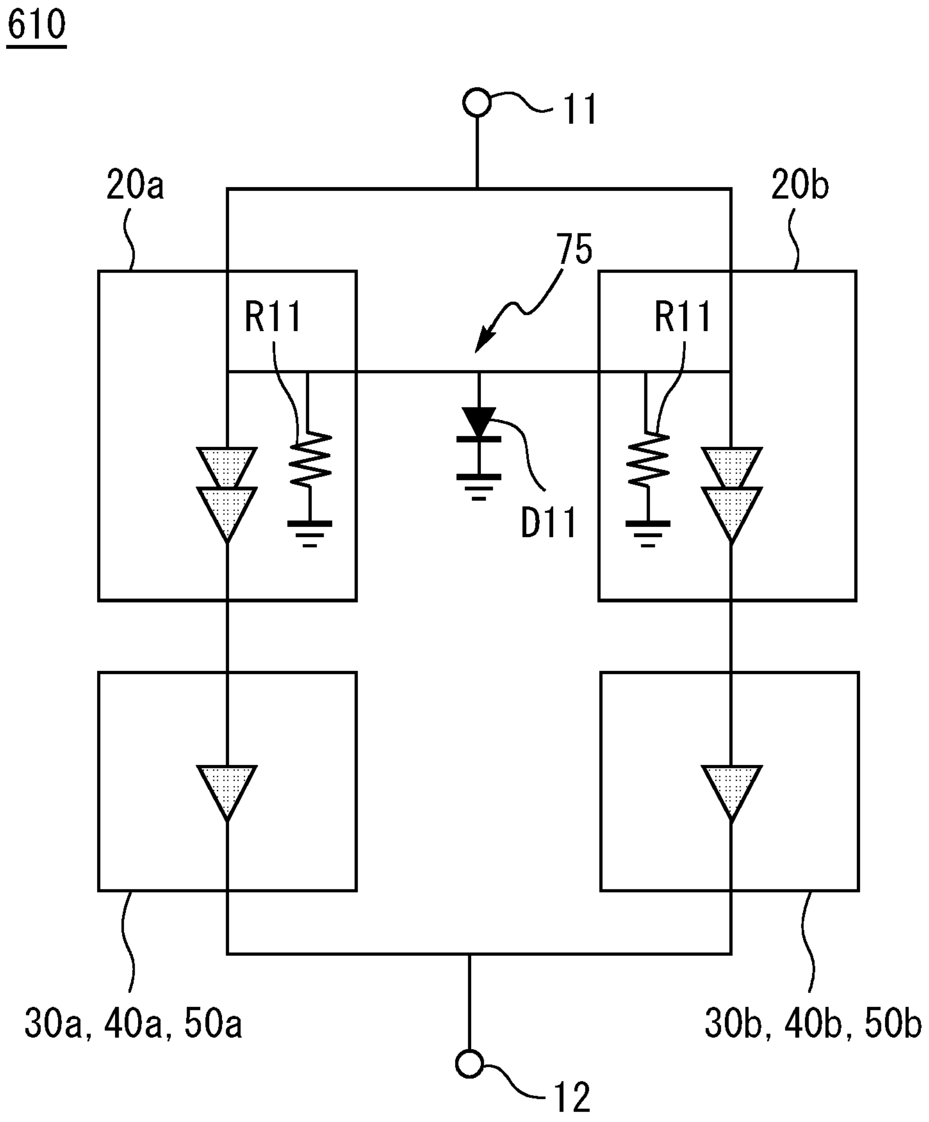
FIG. 14 is a plan view of the power amplifier according to a modification of the fifth embodiment.

FIG. 14 is a plan view of the power amplifier 610 according to a modification of the fifth embodiment. The resistor R11 may be provided in the MMIC 20.

Note that the technical features described in the above embodiments may be combined as appropriate.

REFERENCE SIGNS LIST

10 power amplifier, 10*a* first path, 10*b* second path, 11 input terminal, 12 output terminal, 13 wire, 15 package,

20, 20*a*, 20*b* MMIC, 21 input pad, 22 drain pad, 23 output pad, 24 input side circuit, 25 inter-stage circuit, 26 output side circuit, 27 quarter wavelength line, 28 substrate, 29 stabilization circuit, 29*a* line for matching, 30, 30*a*, 30*b* input matching circuit, 31 substrate, 32 pattern, 40, 40*a*, 40*b* transistor, 41 substrate, 42 transistor cell, 43 pre-match circuit, 50, 50*a*, 50*b* output matching circuit, 51*a*, 51*b* matching circuit board, 52 substrate, 53 pattern, 55*a*, 55*b* matching circuit board, 56 substrate, 57 pattern, 60, 60*a*, 60*b* drain bias circuit board, 61 substrate, 62 line, 75 diode linearizer, 80 gate bias circuit, 81*a*, 81*c* quarter wavelength open stub, 81*b*, 81*d* quarter wavelength line, 90 drain bias circuit, 91 short stub, 91*a* quarter wavelength open stub, 91*b* quarter wavelength line, 91*c* quarter wavelength open stub, 91*d* quarter wavelength line, 100 radio frequency module, 210 power amplifier, 258*a*, 258*b* short stub, 325 voltage divider circuit, 410, 510, 610 power amplifier, 800 radio frequency module, 810*a*~810*c* internal matching type FET, C21, C22 capacitor, C29 bypass capacitor, C70, C71, C72, C91 capacitor, D11 diode, L21~L23, L61 choke inductor, R11, R21~R26, R29 resistor, Tr21, Tr21*a*, Tr22*b*, Tr22, Tr22*a*~Tr22*d* transistor, Vdd drain bias supply point, Vgg gate bias supply point

The invention claimed is:

1. A power amplifier comprising:

an input terminal configured to receive a high-frequency signal from an outside;

an MMIC configured to receive the high-frequency signal via the input terminal and to amplify the high-frequency signal;

an input matching circuit;

a transistor configured to receive, via the input matching circuit, the high-frequency signal amplified by the MMIC and to amplify the high-frequency signal;

an output matching circuit;

an output terminal configured to receive a drain voltage of the transistor from the outside, to receive, via the output matching circuit, the high-frequency signal amplified by the transistor, and to output the high-frequency signal to the outside; and a drain bias circuit board configured to connect a drain of the transistor and a drain of the MMIC, wherein the transistor and the MMIC are conjugately matched at impedance smaller than 50Ω.

2. The power amplifier according to claim 1, wherein a gate voltage of the MMIC is configured to be input to the input terminal from the outside.

3. The power amplifier according to claim 1, wherein the power amplifier includes only the input terminal and the output terminal as terminals.

4. The power amplifier according to claim 1, wherein, in the drain bias circuit board, a choke inductor is provided on a line connecting the drain of the transistor and the drain of the MMIC.

5. The power amplifier according to claim 1, wherein a path connecting the drain of the transistor and the drain of the MMIC via the drain bias circuit board is connected to a terminal for grounding by a first capacitor.

6. The power amplifier according to claim 5, wherein the first capacitor has a capacity with which impedance viewed from the transistor is 50 $2 or less with respect to a difference frequency of the high-frequency signal.

7. The power amplifier according to claim 5, further comprising a short stub provided on the path and having line length that is a quarter of a wavelength of the high-frequency signal.

8. The power amplifier according to claim 5, wherein the drain bias circuit board has line length that is a quarter of a wavelength of the high-frequency signal.

9. The power amplifier according to claim 1, further comprising a voltage divider circuit configured to divide a gate voltage input from the outside via the input terminal, wherein a voltage obtained by dividing the gate voltage by the voltage divider circuit is configured to be supplied to a gate of an amplifier in the MMIC or a gate of the transistor.

10. The power amplifier according to claim 9, wherein a voltage supplied to the gate of the amplifier from the voltage divider circuit and a voltage supplied to the gate of the transistor from the voltage divider circuit are configured to be different.

11. The power amplifier according to claim 10, wherein the amplifier is formed on an Si substrate, and the transistor is formed on an SiC substrate.

12. The power amplifier according to claim 9, wherein a voltage with which a gain decreases with respect to input power is configured to be supplied to one of the amplifier and the transistor from the voltage divider circuit, and a voltage with which the gain increases with respect to the input power is configured to be supplied to another of the amplifier and the transistor from the voltage divider circuit.

13. The power amplifier according to claim 1, further comprising:

a first one of a plurality of the MMICs;

a second one of the plurality of MMICs;

a first one of a plurality of the transistors configured to amplify a high-frequency signal amplified by the first MMIC;

a second one of the plurality of transistors configured to amplify a high-frequency signal amplified by the second MMIC;

a first one of a plurality of the drain bias circuit boards configured to connect a drain of the first transistor and a drain of the first MMIC; and a second one of the plurality of drain bias circuit boards configured to connect a drain of the second transistor and a drain of the second MMIC, wherein the first drain bias circuit board and the second drain bias circuit board are disposed on an outer side of a region where the first MMIC, the second MMIC, the first transistor, and the second transistor are disposed.

14. The power amplifier according to claim 1, further comprising:

a first one of a plurality of the MMICs;

a second one of the plurality of MMICs;

a first one of a plurality of the transistors configured to amplify a high-frequency signal amplified by the first MMIC; and a second one of the plurality of transistors configured to amplify a high-frequency signal amplified by the second MMIC, wherein the drain bias circuit board is disposed between a first path passing through the first MMIC and the first transistor from the input terminal and reaching the output terminal and a second path passing through the second MMIC and the second transistor from the input terminal and reaching the output terminal.

15. The power amplifier according to claim 1, further comprising:

a first one of a plurality of the MMICs;

a second one of the plurality of MMICs;

a first one of a plurality of the transistors configured to amplify a high-frequency signal amplified by the first MMIC;

a second one of the plurality of transistors configured to amplify a high-frequency signal amplified by the second MMIC; and a diode linearizer disposed between a first path passing through the first MMIC and the first transistor from the input terminal and reaching the output terminal and a second path passing through the second MMIC and the second transistor from the input terminal and reaching the output terminal.

16. A radio frequency module comprising the power amplifier according to claim 1.

17. The radio frequency module according to claim 16, further comprising a drain bias supply point for supplying the drain voltage to the output terminal, wherein a path connecting the drain of the transistor and the drain of the MMIC via the drain bias circuit board is connected to a terminal for grounding by a first capacitor, and a path connecting the drain bias supply point and the output terminal is connected to the terminal for grounding by a second capacitor.

18. The radio frequency module according to claim 17, wherein the second capacitor has a capacity with which impedance viewed from the transistor is 50 $2 or less with respect to a difference frequency of the high-frequency signal.

* * * * *